(12) United States Patent
Oh et al.

(10) Patent No.: US 9,837,160 B1
(45) Date of Patent: Dec. 5, 2017

(54) NONVOLATILE MEMORY DEVICE INCLUDING SUB COMMON SOURCES

(71) Applicant: SK hynix Inc., Gyeonggi-do (KR)

(72) Inventors: Sung-Lae Oh, Chungcheongbuk-do (KR); Jin-Ho Kim, Gyeonggi-do (KR); Sang-Hyun Sung, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/294,948

(22) Filed: Oct. 17, 2016

(30) Foreign Application Priority Data

May 10, 2016 (KR) .................. 10-2016-0056849
Jul. 20, 2016 (KR) .................. 10-2016-0091742

(51) Int. Cl.
| | | |
|---|---|---|
| *G11C 16/08* | (2006.01) | |
| *G11C 16/16* | (2006.01) | |
| *G11C 16/24* | (2006.01) | |
| *G11C 16/04* | (2006.01) | |
| *G11C 14/00* | (2006.01) | |

(52) U.S. Cl.
CPC .......... *G11C 16/16* (2013.01); *G11C 14/0063* (2013.01); *G11C 16/0483* (2013.01); *G11C 16/08* (2013.01); *G11C 16/24* (2013.01)

(58) Field of Classification Search
CPC .................................................. G11C 16/08
USPC .................................................. 365/185.11
See application file for complete search history.

(56) References Cited

U.S. PATENT DOCUMENTS

| | | | | |
|---|---|---|---|---|
| 2007/0127294 | A1* | 6/2007 | Umezawa .......... | G11C 16/0416 365/185.18 |
| 2013/0083599 | A1* | 4/2013 | Nam ...................... | G11C 16/14 365/185.11 |
| 2013/0272067 | A1* | 10/2013 | Lee ........................ | G11C 16/10 365/185.11 |
| 2014/0063947 | A1* | 3/2014 | Ghodsi ............. | G11C 16/0483 365/185.11 |
| 2017/0092364 | A1* | 3/2017 | Lee ........................ | G11C 16/34 |

FOREIGN PATENT DOCUMENTS

KR  1020150129940  11/2015

* cited by examiner

*Primary Examiner* — Huan Hoang
*Assistant Examiner* — Minh Dinh
(74) *Attorney, Agent, or Firm* — IP & T Group LLP

(57) ABSTRACT

A nonvolatile memory device includes a memory block including a plurality of cell strings each of which includes memory cells electrically coupled with word lines stacked over a substrate; a plurality of sub common sources electrically coupled to one ends of the cell strings; and a plurality of bit lines electrically coupled to the other ends of the cell strings, wherein the memory block includes sub blocks respectively corresponding to the sub common sources, and cell strings electrically coupled to the same bit line among the cell strings are included in the same sub block.

18 Claims, 15 Drawing Sheets

Sub-block1: CS11, CS21, CS13, CS23
Sub-block2: CS12, CS22, CS14, CS24

SCSL1: SCSL1-1, SCSL1-2, SCSL1-3
SCSL2: SCSL2-1, SCSL2-2

# NONVOLATILE MEMORY DEVICE INCLUDING SUB COMMON SOURCES

CROSS-REFERENCE TO RELATED APPLICATION

The present application claims priority under 35 U.S.C. §119(a) to Korean Patent Application No. 10-2016-0056849 filed in the Korean Intellectual Property Office (KIPO) on May 10, 2016, and Korean Patent Application No. 10-2016-0091742 filed in the KIPO on Jul. 20, 2016, the disclosures of which are incorporated herein by reference in their entireties.

BACKGROUND

1. Technical Field

Various embodiments generally relate to a semiconductor nonvolatile memory device.

2. Related Art

A semiconductor memory device is a memory device which is realized using a semiconductor such as silicon (Si) germanium (Ge), gallium arsenide (GaAs) and indium phosphide (InP) and may be generally classified as a volatile memory device or a nonvolatile memory device.

A volatile memory device is a memory device in which stored data is lost when power supply is turned off. A volatile memory device may include a static random access memory (SRAM), a dynamic RAM (DRAM), and a synchronous DRAM (SDRAM). A nonvolatile memory device retains data stored therein even when power supply to the device is turned off. A nonvolatile memory device may include a read only memory (ROM), a programmable ROM (PROM), an electrically programmable ROM (EPROM), an electrically erasable and programmable ROM (EEPROM), a FLASH memory, a phase-change RAM (PRAM), a magnetic RAM (MRAM), a resistive RAM (RRAM), and a ferroelectric RAM (FRAM).

Recently, in order to improve the degree of integration of a semiconductor memory device, a semiconductor memory device having a 3-dimensional structure is being researched actively.

SUMMARY

In an embodiment, a nonvolatile memory device may include: a memory block including a plurality of cell strings each of which includes memory cells electrically coupled with word tines stacked over a substrate; a plurality of sub common sources electrically coupled to one terminal of each of the cell strings; and a plurality of bit lines electrically coupled to the other terminal of each of the cell strings, wherein the memory block includes sub blocks respectively corresponding to the sub common sources, and cell strings electrically coupled to the same bit line among the cell strings are included in the same sub block.

In an embodiment, a nonvolatile memory device may include: a memory block electrically coupled to word lines stacked over a substrate; a first sub common source and a second sub common source arranged in a direction of the word lines; and a plurality of first bit lines formed over the memory block and corresponding to the first sub common source, and a plurality of second bit lines formed over the memory block and corresponding to the second sub common source, the memory block including: a first sub block including a plurality of first cell strings which are electrically coupled between the first bit lines and the first sub common source; and a second sub block including a plurality of second cell strings which are electrically coupled between the second bit lines and the second sub common source.

In an embodiment, a nonvolatile memory device may include: bit lines including odd bit lines and even bit lines; a memory block disposed under the bit lines; and a first sub common source and a second sub common source disposed under the memory block and arranged, in a direction of the bit lines, the memory block including: a first sub block including a plurality of first cell strings which are electrically coupled between the odd bit lines and the first sub common source; and a second sub block including a plurality of second cell strings which are electrically coupled between the even bit lines and the second sub common source.

BRIEF DESCRIPTION OF THE DRAWINGS

These and other features of the present invention will become apparent f the following detailed description of embodiments of the present invention in reference with the following figures in which.

DETAILED DESCRIPTION

Figure 1:
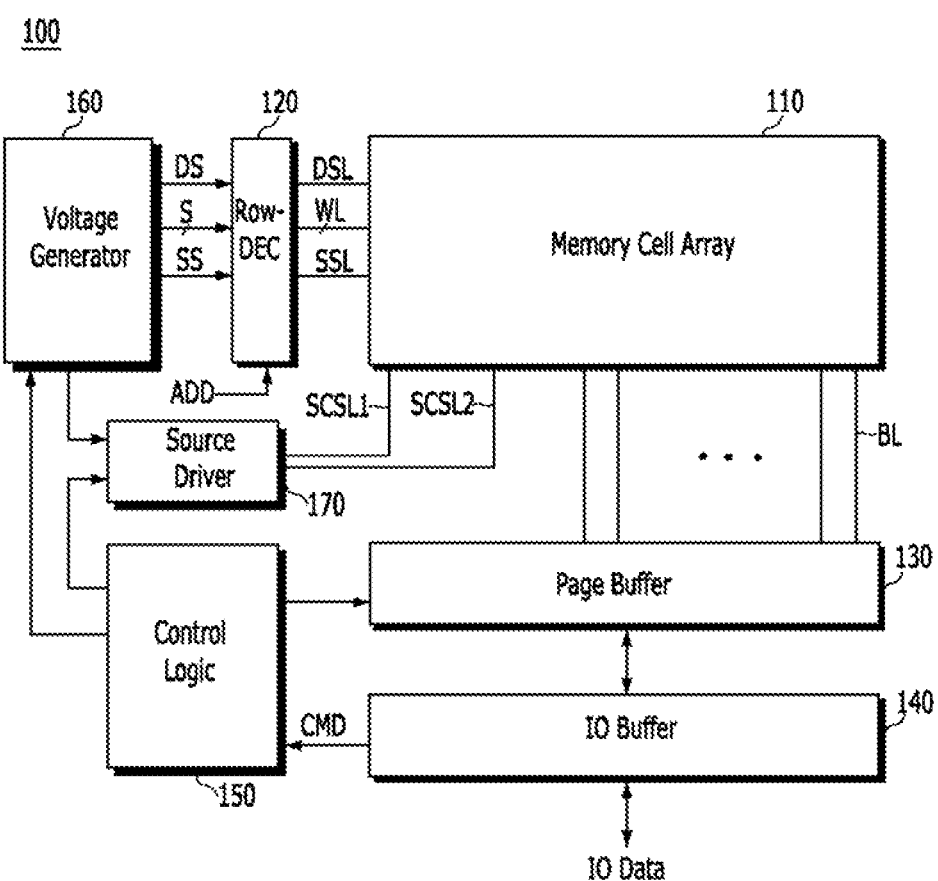
FIG. 1 is a block diagram illustrating a nonvolatile memory device, according to an embodiment of the present invention.

Hereinafter, various embodiments of the present invention including a nonvolatile memory device will be described below with reference to the accompanying drawings.

The present disclosure, however, may be embodied in various different forms, and should not be construed as being limited to the illustrated embodiments herein. Rather, these embodiments are provided as examples so that this disclosure will be thorough and complete, and will fully convey the various aspects and features of the present invention to those skilled in the art.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

Spatially relative terms, such as "under," "below," "lower," "above," "upper" and the like, may be used herein for ease of description to describe one, element or feature's relationship to another element(s) or feature(s) as illustrated in the figures. It will be understood that the spatially relative terms are intended to encompass different orientations of the device in manufacturing, use or operation in addition to the orientation depicted in the figures. For example, if the device in the figures is turned over, elements described as "below" or "under" other elements or features would then be "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or a of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

FIG. 1 illustrates a nonvolatile memory device 100, according to an embodiment of the present invention.

Referring to FIG. 1, the nonvolatile memory device 100 may include a memory cell array 110 and peripheral circuits. The peripheral circuits may include a row decoder 120, a page buffer 130, an input/output buffer 140, a control logic 150, a voltage generator 160 and a source driver 170.

The memory cell array 110 may be electrically coupled to the row decoder 120 through word lines WL and select lines DSL (drain select lines) and SSL (source select lines). The memory cell array 110 may be electrically coupled to the page buffer 130 through bit lines BL. The memory cell array 110 may be electrically coupled to the source driver 170 through sub common sources SCSL1 and SCSL2.

The memory cell array 110 may include a plurality of memory blocks. The memory cell array 110 may have a 3-dimensional structure. Each of the memory blocks may include a plurality of cell strings each cell string vertically arranged on a semiconductor substrate. A cell string may include a unit of memory cells which are coupled in series. The memory cells may be coupled in series between a source select transistor and a drain select transistor. Memory cells included in each cell string may be selected by the same drain and source select transistors. Each of the memory blocks may include a plurality of pages. A page may be unit of memory cells which are coupled to the same word line.

Each of the memory blocks may include at least two sub blocks. A sub block may correspond to an erase unit. The pages of each memory block may also be divided by the sub blocks.

The sub blocks may be coupled via corresponding sub common sources SCSL1 and SCSL2 to the source driver 170. In an erase operation, voltages from the source driver 170 may be independently applied to the sub common sources SCSL1 and SCSL2. In an erase operation, an erase voltage (for example, 20V) may be applied to a sub common source coupled to a selected sub block, and an unselected erase voltage (for example, 0V) may be applied to a sub common source corresponding to an unselected sub block. Therefore, the nonvolatile memory device 100 may perform an erase operation in units of sub blocks.

Figure 14:
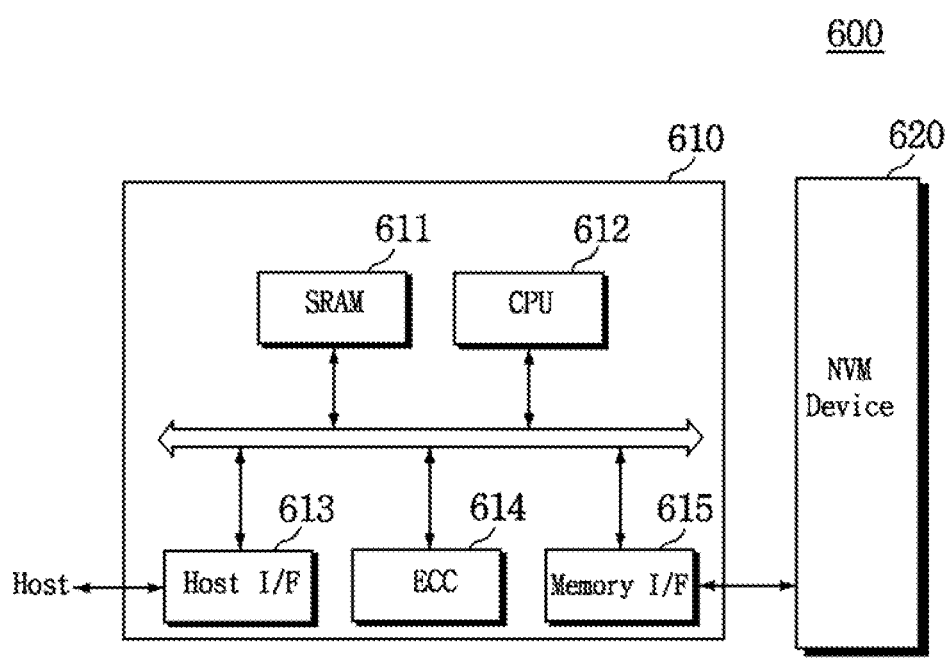
FIG. 14 is a simplified block diagram schematically illustrating a memory system including a nonvolatile memory device, according to an embodiment of the present invention.

The row decoder 120 may select a memory block of the memory cell array 110 in response to an address ADD received, for example, from a controller coupled to the semiconductor memory device 100. An example of a controller 610 coupled to a semiconductor memory device 620 is illustrated in FIG. 14. The row decoder 120 may select a word line WL of a selected memory block based on a page address which may be included in the address ADDR received from the controller. The row decoder 120 may transfer driving signals from the voltage generator 160, to the word lines WL or the select lines DSL and SSL of a selected memory block. In order to transfer the driving signals to the word lines WL or the select lines DSL and SSL of a selected memory block, the row decoder 120 may include pass transistor stages respectively corresponding to the memory blocks included in the memory cell array 110. Each of the pass transistor stages may include a plurality of pass transistors which provide driving signals to the word lines WL or the select lines DSL and SSL of a corresponding memory block in response to a block select signal.

In an erase operation, the row decoder 120 may apply the voltage provided from the voltage generator 160, to the word lines WL and the select lines DSL and SSL of a selected memory block. For instance, in the erase operation the row decoder 120 may apply a ground voltage (Vss) to the word lines WL of the selected memory block. Further, the row decoder 120 may apply the ground voltage (Vss) to the select lines DSL and SSL of the selected memory block. After a predetermined time passes from a point of time when the ground voltage (Vss) is applied to the select lines DSL and SSL, the row decoder 120 may float the select lines DSL and SSL.

The page buffer 130 may operate as a write driver or a sense amplifier according to an operation mode. In a program operation, the page buffer 130 operates as a write driver and may transfer a voltage corresponding to data to be programmed, to the bit lines BL of the memory cell array 110. In a read operation, the page buffer 130 may sense the data stored in selected memory cells, through the bit lines BL, and transfer the sensed data to the input/output buffer 140. In an erase operation, the page buffer 130 may float the bit lines BL of the memory cell array 110.

In a program operation, the input/output buffer 140 may transfer the write data inputted from an external device, to the page buffer 130. In a read operation, the input/output buffer 140 may output the data provided from the page buffer 130, to the external device. The input/output buffer 140 may transfer a command CMD such as a read, program or an erase command to the control logic 150 in response to a corresponding read, program or erase request received from an external device such as a controller of a memory system. The input/output buffer 140 may also transfer the address ADD to the row decoder 120.

The control logic 150 may control the page buffer 130 and the voltage generator 160 to access selected memory cells, in response to the command CMD transferred from the input/output buffer 140. The control logic 150 may control the source driver 170 to apply the erase voltage to a sub common source corresponding to a selected sub block, in the erase operation. The control logic 150 may control the source driver 170 to apply the unselected erase voltage to a sub common source corresponding to an unselected sub block, in the erase operation.

The voltage generator 160 may be electrically coupled to the control logic 150, the row decoder 120 and the source driver 170. The voltage generator 160 may operate according to control of the control logic 150. The voltage generator 160 may be configured to generate a high voltage. The high voltage generated by the voltage generator 160 may be transferred to the plurality of word lines WL and the select lines DSL and SSL coupled to the memory cell array 110, through the row decoder 120. The high voltage generated by the voltage generator 160 may be transferred to the sub common sources SCSL1 and SCSL2 coupled to the memory cell array 110, through the source driver 170.

The source driver 170 may be controlled by the control logic 150, and be provided with various voltages from the voltage generator 160. In the erase operation the source driver 170 may apply the erase voltage to a sub common source corresponding to a selected sub block, by being controlled by the control logic 150, In the erase operation, the source driver 170 may apply the unselected erase voltage to a sub common source corresponding to an unselected sub block, by being controlled by the control logic 150.

In order to improve the degree of integration, a method of increasing the number of memory cells included in unit cell string has been suggested. However, if the number of memory cells included in unit cell string is increased, the number of word lines is also increased in correspondence to the increased number of the memory cells. Accordingly, as the number of pass transistors to provide driving signals to word lines is increased the area of the row decoder 120 cannot help but be increased. Moreover, because the number of wiring lines which couple word lines and the row decoder 120 is increased as well in correspondence to the increased number of word lines, a wiring line patterning margin may be decreased.

Hereupon, as a method for improving the degree of integration and preventing occurrence of the above-described problems, a method of increasing the number of cell strings included in unit memory block has been disclosed. In order to improve the efficiency of a nonvolatile memory device, it is necessary to shorten a time required to rewrite data after erasing the data stored in a memory block. If the number of cell strings included in a unit memory block is increased, when performing an erase operation according to an existing scheme of performing erasure by the unit of memory block, a lengthy time is required and thus memory efficiency deteriorates.

According to an embodiment of the present invention, by dividing each memory block into at least two sub blocks, an erase operation may be performed in units of sub blocks. Erasure in units of sub blocks, as a scheme of erasing a part of the capacity of a memory block, has an advantage in that memory efficiency may be improved since it is possible to quickly and efficiently erase data of small capacity.

Hereinbelow, the memory cell array 110 will be described in detail with reference to FIG. 2.

Figure 2:
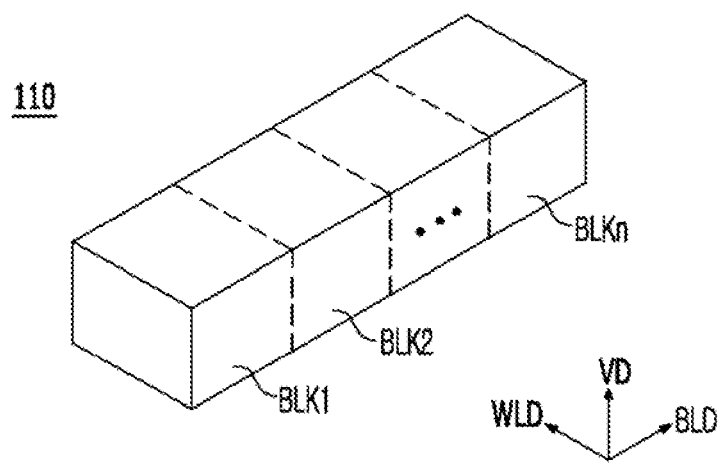
FIG. 2 is a diagram illustrating a three-dimensional configuration of a memory cell array included in the nonvolatile memory device shown in FIG. 1, according to an embodiment of the present invention.

Referring to FIG. 2, the memory cell array 110 may include a plurality of memory blocks BLK1 to BLKn.

Each of the memory blocks BLK1 to BLKn may have a 3-dimensional structure. Each of the memory blocks BLK1 to BLKn may include a structure which extends in a bit line direction BLD, a word line direction WLD and a height direction D. Each of the memory blocks BLK1 to BLKn may include a plurality of cell strings each cell extending in the height direction VD. A plurality of cell strings may be provided spaced apart along the bit line direction BLD and a plurality of cell strings may be provided spaced apart along the word line direction WLD.

Each of the memory blocks BLK1 to BLKn may be electrically coupled to a plurality of bit lines, at least one drain select line, a plurality of word lines, at least one source select line, and at least two sub common sources. Each of the cell strings may be electrically coupled to one bit line, at least one drain select line, a plurality of word lines, at least one source select line, and one of the two sub common sources.

Various embodiments for the construction of each of the memory blocks BLK1 to BLKn will become apparent through the following descriptions made with reference to FIGS. 3 to 13.

Figure 3:
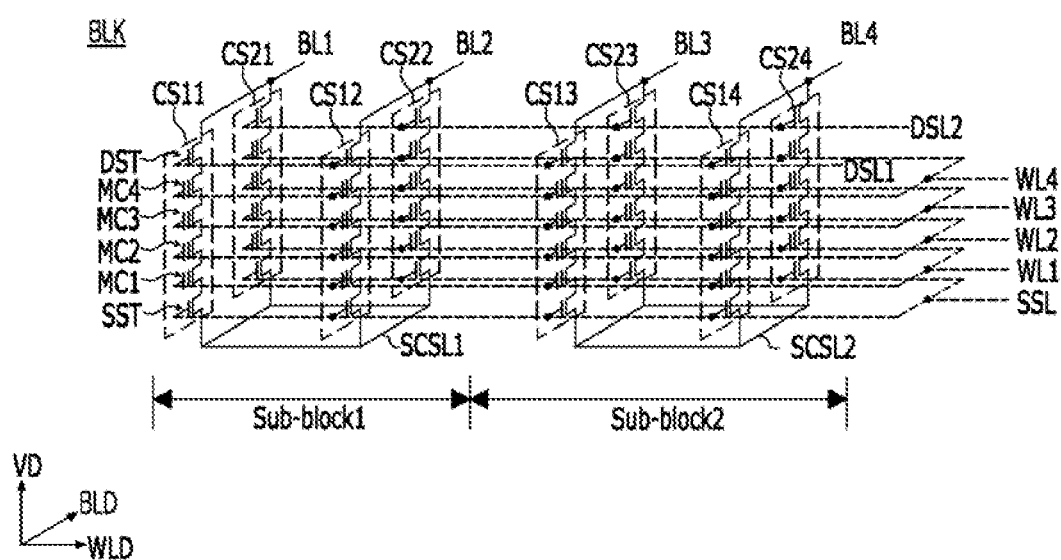
FIG. 3 is a circuit diagram illustrating a three-dimensional configuration of a memory block included in the memory cell array shown in FIG. 2, according to an embodiment of the present invention.

FIG. 3 is a circuit diagram illustrating a memory block employed in the memory cell array 110 shown in FIG. 2.

Referring to FIG. 3, a memory block BLK may include a plurality of cell strings CS11, CS21, CS12, CS22, CS13, CS23, CS14 and CS24.

The cell strings CS11 and CS21 may be electrically coupled between a first bit line BL1 and a first sub common source SCSL1. The cell strings CS12 and CS22 may be electrically coupled between a second bit line BL2 and the first sub common source SCSL1. The cell strings CS13 and CS23 may be electrically coupled between a third bit line BL3 and a second sub common source SCSL2. The cell strings CS14 and CS24 may be electrically coupled between a fourth bit line BL4 and the second sub common source SCSL2.

The memory block BLK may include a plurality of sub blocks e.g., Sub-block1 and Sub-block2. The sub block Sub-block1 may include the cell strings CS11, CS21, CS12 and CS22, and the sub block Sub-block2 may include the cell strings CS13, CS23, CS14 and CS24. Hereinbelow, for the sake of convenience in explanation, the sub block Sub-block1 will be referred to as a first sub block, and the sub block Sub-block2 will be referred to as a second sub block.

The first sub block Sub-block1 may correspond to the first sub common source SCSL1, and the cell strings CS11, CS21, CS12 and CS22 included in the first sub block Sub-block1 may be electrically coupled in common to the first sub common source SCSL1. The second sub block Sub-block2 may correspond to the second sub common source SCSL2, and the cell strings CS13, CS23, CS14 and CS24 included in the second sub block Sub-block2 may be electrically coupled in common to the second sub common source SCSL2. That is to say, cell strings included in the same sub block may be electrically coupled in common to the same sub common source, and cell strings included in different sub blocks may be electrically coupled to different sub common sources.

The first and second sub common sources SCSL1 and SCSL2 may be arranged in the word line direction WLD. Similarly to the first and second sub common sources SCSL1 and SCSL2, the first and second sub blocks Sub-block1 and Sub-block2 may be arranged in the word line direction WLD.

The cell strings CS11 and CS21 included in the first sub block Sub-block1 may be electrically coupled to the first bit line BL1, and the cell strings CS12 and CS22 included in the first sub block Sub-block1 may be electrically coupled to the second bit line BL2. The cell strings CS13 and CS23 included in the second sub block Sub-block2 may be electrically coupled to the third bit line BL3, and the cell strings CS14 and CS24 included in the second sub block Sub-block2 may be electrically coupled to the fourth bit line BL4. Hence, according to the configuration of FIG. 3, cell strings electrically coupled to the same bit line are included in the same sub block, while cell strings included in different sub blocks are electrically coupled to different bit lines.

The first and second bit lines BL1 and BL2 correspond to the first sub block Sub-block1 and are electrically coupled to the cell strings CS11, CS21, CS12 and CS22 included in the first sub block Sub-block1, whereas the third and fourth bit lines BL3 and BL4 correspond to the second sub block Sub-block2 and are electrically coupled to the cell strings CS13, CS23, CS14 and CS24 included in the second sub block Sub-block2. Hereinbelow, for the sake of convenience in explanation, the first and second bit lines BL1 and BL2 corresponding to the first sub block Sub-block1 will be referred to as first sub block bit lines, and the third and fourth bit lines BL3 and BL4 corresponding to the second sub block Sub-block2 will be referred to as second sub block bit lines.

Each of the cell strings CS11, CS21, CS12, CS22, CS13, CS23, CS14 and CS24 may include a drain select transistor DST, a plurality of memory cells MC1 to MC4 and a source select transistor SST which are coupled in series in a direction perpendicular to the main surface of a substrate (not shown). In each of the cell strings CS11, CS21, CS12, CS22, CS13, CS23, CS14 and CS24, the memory cells MC1 to MC4 may be coupled in series between the drain select transistor DST and the source select transistor SST. The memory cells MC1 to MC4 may include main memory cells which are used to store valid data. The memory cells MC1 to MC4 may further include, in addition to main memory cells, dummy memory cells which are not used to store valid data but for storing dummy data One terminal of each of the source select transistors SST of the cell strings CS11, CS21, CS12 and CS22 included in the first sub block Sub-block1 may be electrically coupled to the memory cells MC1 and the other terminal thereof may be electrically coupled in common to the first sub common source SCSL1. One terminal of each of the source select transistors SST of the cell strings CS13, CS23, CS14 and CS24 included in the second sub block Sub-block2 may be electrically coupled to the memory cells MC1, and the other terminal thereof may be electrically coupled in common to the second sub common source SCSL2.

One terminal of each of the drain select transistors DST of the cell strings CS11, CS21, CS12 and CS22 included in the first sub block Sub-block1 may be electrically coupled to the first sub block bit lines BL1 and BL2, and the other terminal thereof may be electrically coupled to the memory cells MC4. One terminal of each of the drain select transistors DST of the cell strings CS13, CS23, CS14 and CS24 included in the second sub block Sub-block2 may be electrically coupled to the second sub block bit lines BL3 and BL4, and the other terminal thereof may be electrically coupled to the memory cells MC4.

Hereinbelow, cell strings will be defined in terms of row, column and height. Cell strings coupled in common to one bit line may form one column. For example, the cell strings CS11 and CS21 coupled to the first bit line BL1 form a first column. The cell strings CS12 and CS22 coupled to the second bit line BL2 form a second column. The cell strings CS13 and CS23 coupled to the third bit line BL3 form a third column. The cell strings CS14 and CS24 coupled to the fourth bit line BL4 form a fourth column.

Cell strings coupled to one drain select line may form one row. For example, the cell strings CS11, CS12, CS13 and CS14 coupled to a drain select line DSL1 form a first row.

The cell strings CS21, CS22, CS23 and CS24 coupled to a drain select line DSL2 form a second row. A direction that extends from the source select transistors SST to the drain select transistors DST is defined as the height direction VD.

Among the cell strings CS11, CS21, CS12 CS22, CS13, CS23, CS14 and CS24 included in the first and second sub blocks Sub-block1 and Sub-block2, cell strings of the same row may be electrically coupled to the same drain select line. Cell strings of different rows may be electrically coupled to different drain select lines.

The cell strings CS11, CS21 CS12, CS22, CS13 CS23, CS14 and CS24 included in the first and second sub blocks Sub-block1 and Sub-block2 may share a source select line SSL. In the cell strings CS11, CS21, CS12, CS22, CS13, CS23, CS14 and CS24 of the first and second sub blocks Sub-block1 and Sub-block2, memory cells of the same height may share a word line. That is to say, word lines of cell strings included in different sub blocks at the same height may be electrically coupled in common.

Memory cells coupled to the same word line may construct one page, and the memory block BLK may include a plurality of pages arranged in the height direction VD. For example, 8 memory cells coupled to a word line WL1 may construct one page. Among 8 memory cells included in unit page, 4 memory cells belonging to the cell strings CS11, CS21 CS12 and CS22 may be included in the first sub block Sub-block1, and 4 memory cells belonging to the cell strings CS13, CS23, CS14 and CS24 may be included in the second sub block Sub-block2. In other words, each page may be divided by the sub blocks Sub-block1 and Sub-block2.

For instance, in FIG. 3, the memory block BLK is illustrated as including 2 sub blocks Sub-block1 and Sub-block2. However, the number of sub blocks included in a memory block is not limited thereto, and at least two sub blocks may be provided in the word line direction WLD.

For instance, in FIG. each of the sub blocks Sub-block1 and Sub-block2 is illustrated as including 4 cell strings. However, the number of cell strings included in each of the sub blocks Sub-block1 and Sub-block2 is not limited thereto, and, among cell strings included in each of the sub blocks Sub-block1 and Sub-block2, one or more cell strings may be provided in each of the bit line direction BLD and the word line direction WLD.

For instance, it is illustrated in FIG. 3 that the source select transistors SST are electrically coupled in common to one source select line SSL. However, it is to be noted that the structure of the memory block BLK may be changed and applied in such a manner that, similarly to the drain select transistors DST, source select transistors SST of the same row are electrically coupled in common to one source select line and source select transistors SST of different rows are electrically coupled to different source select lines.

For instance, it is illustrated in FIG. 3 that one drain select transistor DST and one source select transistor SST are provided in each cell string. However, it is to be noted that at least two drain select transistors or at least two source select transistors may be provided in each cell string.

For instance, it is illustrated in FIG. 3 that each cell string includes 4 memory cells MC1 to MC4. However, it is to be noted that at least one memory cell may be provided in each cell string.

Figure 4:
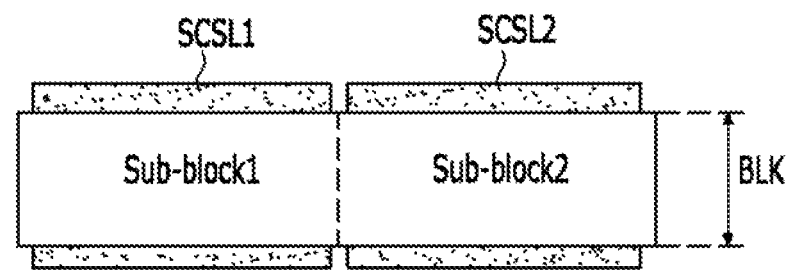
FIG. 4 is a plan view a memory block included in the memory cell array shown in FIG. 2, according to an embodiment of the present invention.
Figure 4:
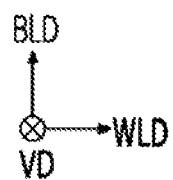
Figure 5:
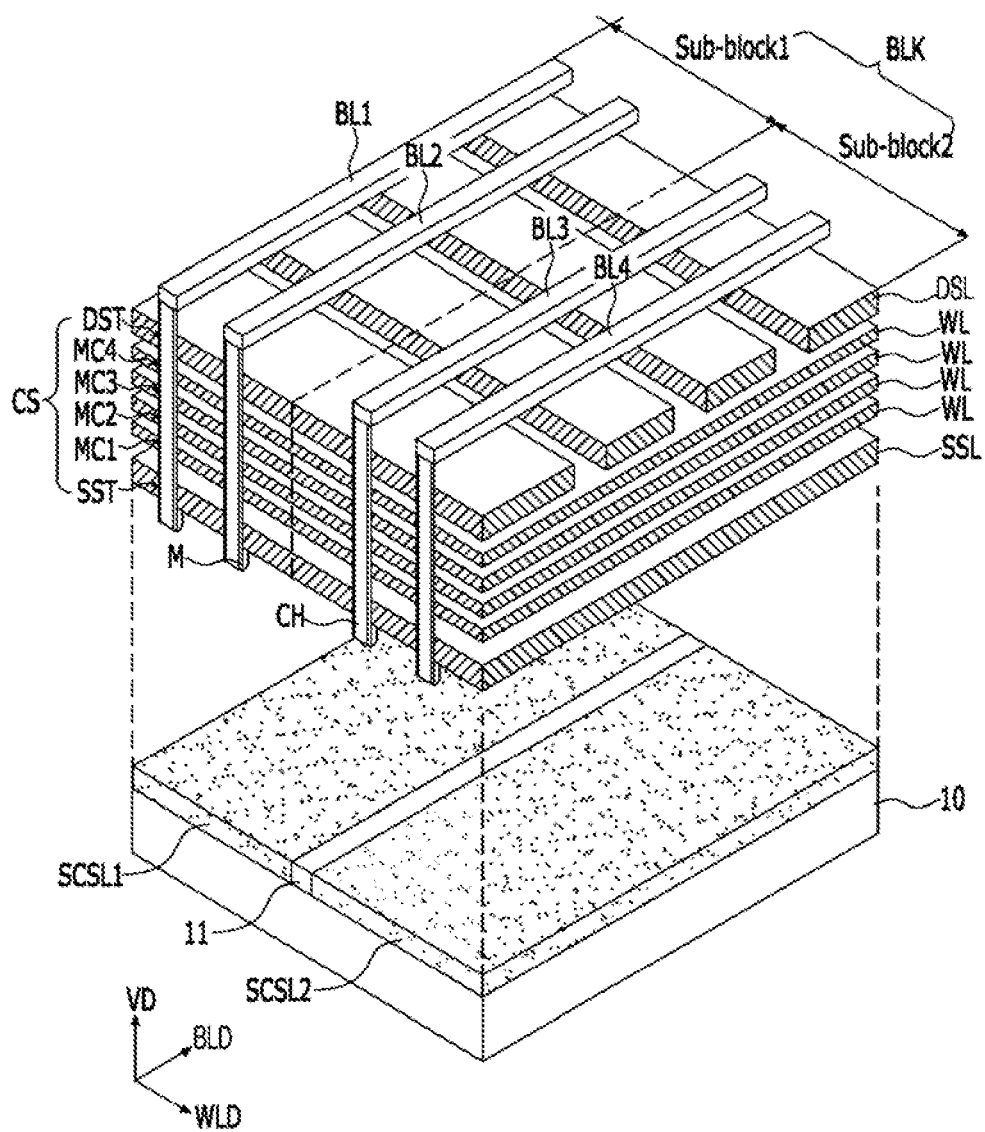
FIG. 5 is a perspective view illustrating a structure of a memory block included in the memory cell array shown in FIG. 2, according to an embodiment of the present invention.

FIG. 4 is a plan view illustrating a structure corresponding to any one of the memory blocks shown in FIG. 2, and FIG. 5 is a perspective view illustrating a structure corresponding to any one of the memory blocks shown in FIG. 2. For the sake of simplification in illustration, illustration of bit lines BL1 to BL4 is omitted in FIG. 4.

Referring to FIGS. 4 and 5, a nonvolatile memory device may include a substrate 10, first and second sub common sources SSL1 and SCSL2, a memory block BLK of a 3-dimensional structure formed on the first and second sub common sources SCSL1 and SCSL2 and a plurality of bit lines BL1 to BL4 formed on the memory block BLK.

For instance it is illustrated in FIGS. 4 and 5 that the number of sub common sources SCSL corresponding to the single memory block BLK is 2. However, the number of sub common sources SCSL corresponding to the single memory block BLK is not limited thereto, and it is to be noted that at least two sub common sources SCSL corresponding to the single memory block BLK may be provided.

For instance, it is illustrated in FIG. 5 that the number of bit lines corresponding to the single memory block BLK is 4. However, the number of bit lines corresponding to the single memory block BLK is not limited thereto, and it is to be noted that at least two bit lines corresponding to the single memory block BLK may be provided.

The memory block BLK of a 3-dimensional structure may include a source select line SSL, a plurality of word lines WL a plurality of drain select lines DSL and a plurality of channels CH which are stacked or formed on the first and second sub common sources SCSL1 and SCSL2. Each of the channels CH may pass through the select lines SSL and DSL and the word lines WL.

In the present embodiment, each of the channels CH has a pillar structure which is completely filled up to the center thereof. However, it is to be noted that the embodiment is not limited thereto. Each of the channels CH may have a tube shape in which a central region is open, and in this case, a dielectric layer may be filled in the central region that is open. A memory layer M may be formed on the surfaces of the channels CH. The memory layer M may include a tunnel dielectric layer, a charge storage layer and a charge blocking layer or include at least one of them. The charge storage layer may include at least one of a floating gate, such as a polysilicon layer, which stores charges, a trap layer, such as a nitride layer, which traps charges, and a nano-dot. For reference, the memory layer may include a phase change material in place of the charge storage layer. Further, a memory layer (not shown) which is interposed between the memory layer M and the word lines WL and covers the top surfaces and bottom surfaces of the word lines WL may be additionally formed. The additionally formed memory layer may include a tunnel dielectric layer, a charge storage layer and a charge blocking layer or may include at least one of them. The charge blocking layer of the additionally formed memory layer may be a stack layer of an oxide layer and a high-k material layer.

Source select transistors SST are formed where the source select line SSL surrounds the channels CH, memory cells MC are formed where the word lines WL surround the channels CH, and drain select transistors DST are formed where the drain select lines DSL surround the channels CH. By the above-described structure, a plurality of cell strings CS including the drain select transistors DST, the memory cells MC and the source select transistors SST which are formed along the respective channels CH may be constructed.

As in the embodiment shown in FIG. 5, the first and second sub common sources SCSL1 and SCSL2 may be formed in the substrate 10. The substrate 10 may include a bulk silicon substrate. The bulk silicon substrate may include a semiconductor material such as a III group, IV group and/or V group element. The first and second sub common sources SCSL1 and SCSL2 may be well regions which are formed by implanting a p type or n type impurity into the substrate 10.

Unlike the embodiment shown in FIG. 5, the first and second sub common sources SCSL1 and SCSL2 may be formed in a semiconductor layer which is disposed between the substrate 10 and the memory block BLK. A circuit layer may be additionally formed between the substrate 10 and the semiconductor layer. Peripheral circuits may be formed in the circuit layer. The peripheral circuits may include the row decoder 120, the page buffer 130 the input/output buffer 140 the control logic 150, the voltage generator 160 and the source driver 170 as shown in FIG. 1. Such a structure will become apparent from the embodiment described later with reference to FIG. 8.

Referring again to FIG. 5, an isolation structure 11 may be formed in the substrate 10 between the first sub common source SCSL1 and the second sub common source SCSL2. The isolation structure 11 may be a dielectric layer. Unlike this, the isolation structure 11 may be an impurity region which is doped with an impurity of a conductivity type opposite to the first and second sub common sources SCSL1 and SCSL2. The isolation structure 11 may have a line shape which extends in the bit line direction BLD, and the first and second sub common sources SCSL1 and SCSL2 may be planar regions arranged in the word line direction WLD with the isolation structure 11 interposed therebetween.

The memory block BLK may include a first sub block Sub-block1 corresponding to the first sub common source SCSL1 and a second sub block Sub-block2 corresponding to the second sub common source SCSL2. The first sub block Sub-block1 and the second sub block Sub-block2 may be disposed on the sub common sources SCSL1 and SCSL2 respectively corresponding to them. Therefore, the first and second sub blocks Sub-block1 and Sub-block2 may be arranged in the word line direction WLD in the same manner as the first and second sub common sources SCSL1 and SCSL2.

Each of the first and second sub blocks Sub-block1 and Sub-block2 may include a plurality of cell strings CS. One terminal of each of the cell strings CS included in the first sub block Sub-block1 may be electrically coupled in common to the first sub common source SCSL1. One terminal of each of the cell strings CS included in the second sub block Sub-block2 may be electrically coupled in common to the second sub common source SCSL2. That is to say, cell strings included in the same sub block are electrically coupled to the same sub common source, and cell strings included in different sub blocks are electrically coupled to different sub common sources.

The bit lines BL1 to BL4 may include first sub block bit lines BL1 and BL2 corresponding to the first sub block Sub-block1 and second sub block bit lines BL3 and BL4 corresponding to the second sub block Sub-block2. The first sub block bit lines BL1 and BL2 and the second sub block bit lines BL3 and BL4 may be disposed on the sub blocks Sub-block1 and Sub-block2 respectively corresponding thereto.

The other terminals of the cell strings CS included in the first sub block Sub-block1 may be electrically coupled to the first sub block bit lines BL1 and BL2. The other terminals of the cell strings CS included in the second sub block Sub-block2 may be electrically coupled to the second sub block bit lines BL3 and BL4.

All cell strings CS coupled to the first bit line BL1 may be included in the first sub block Sub-block1, and all cell strings CS coupled to the second bit line BL2 may be included in the first sub block Sub-block1. All cell strings CS coupled to the third bit line BL3 may be included in the second sub block Sub-block2, and all cell strings CS coupled to the fourth bit line BL4 may be included in the second sub block Sub-block2. That is to say, cell strings coupled to the same bit line are included in the same sub block, and cell strings included in different sub blocks are coupled to different bit lines.

Figure 6:
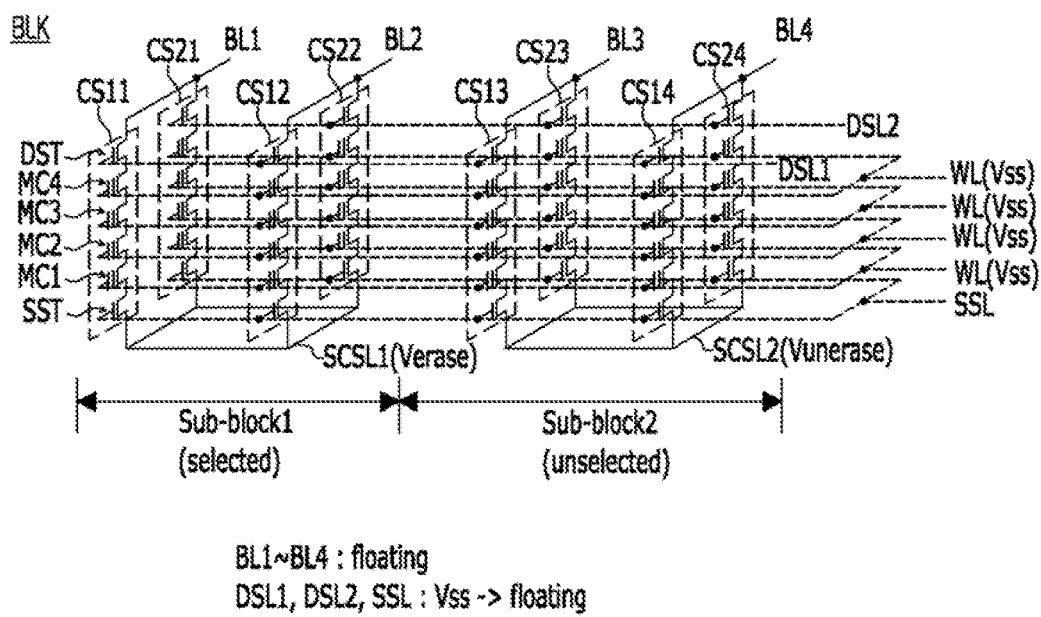
FIG. 6 is a circuit diagram illustrating a bias condition in an erase operation of a first sub block Sub-block1 of the memory block of FIG. 3, according to an embodiment of the present invention.
Figure 6:

FIG. 6 is a circuit diagram illustrating a bias condition in the erase operation of the first sub block Sub-block1 shown in FIG. 3.

It is assumed that, between the first and second sub blocks Sub-block1 and Sub-block2 included in the memory block BLK shown in FIG. 6, the first sub block Sub-block1 is erase-selected and the second sub block Sub-block2 is erase-prohibited.

In the erase operation, a ground voltage (Vss) may be applied to the word lines WL of the selected memory block BLK, and word lines (not shown) of an unselected memory block (not shown) may be floated. An erase voltage (Verase) may be applied to the first sub common source SCSL1 corresponding to the erase-selected first sub block Sub-block1, and an unselected erase voltage (Vunerase) may be applied to the second sub common source SCSL2 corresponding to the erase-prohibited second sub block Sub-block2. For example, the erase voltage (Verase) may have the value of 20V, and the unselected erase voltage (Vunerase) may be the level of the ground voltage (Vss) or a floating level.

The bit lines BL1 to BL4 may be floated, and the source select line SSL and the drain select lines DSL1 and DSL2 may be floated after a predetermined time passes from a point of time when the erase voltage (Verase) is applied to the first sub common source SCSL1 after the source select line SSL and the drain select lines DSL1 and DSL2 are provided with the ground voltage (Vss).

Due to the fact that the ground voltage (Vss) is applied to the source select line SSL and the drain select lines DSL1 and DSL2 before the source select line SSL and the drain select lines DSL1 and DSL2 are floated, the erase voltage (Verase) applied to the first sub common source SCSL1 may be transferred to the channels CH of the cell strings CS included in the first sub block Sub-block1 and the first sub block bit lines BL1 and BL2.

It is noted that if cell strings which are coupled to the same bit line are included in different sub blocks then an unselected sub block may be unintentionally erased. This is because, in an erase operation, an erase voltage applied to a sub common source corresponding to a selected sub block may be transferred to another sub block which is not selected, through the bit line, and as a result, the unselected sub block may be unintentionally erased.

Hence, in the present embodiment, all cell strings coupled to the same bit line are included in the same sub block, and cell strings included in different sub blocks are electrically coupled to different bit lines. Thus, it is possible to prevent a phenomenon that the erase voltage (Verase) applied to a sub common source corresponding to a selected sub block is transferred to another sub block which is not selected, through a common bit line. Thus, it is possible to prevent a phenomenon that an unselected sub block is unintentionally erased.

In the embodiment described above with reference to FIGS. 3 to 6, it is illustrated, as an example, that the channels CH are formed in the shape of 'I,' the bit lines BL1 to BL4 are disposed on the memory block BLK and the sub common sources SCSL1 and SCSL2 are disposed under the memory block BLK.

Figure 7:
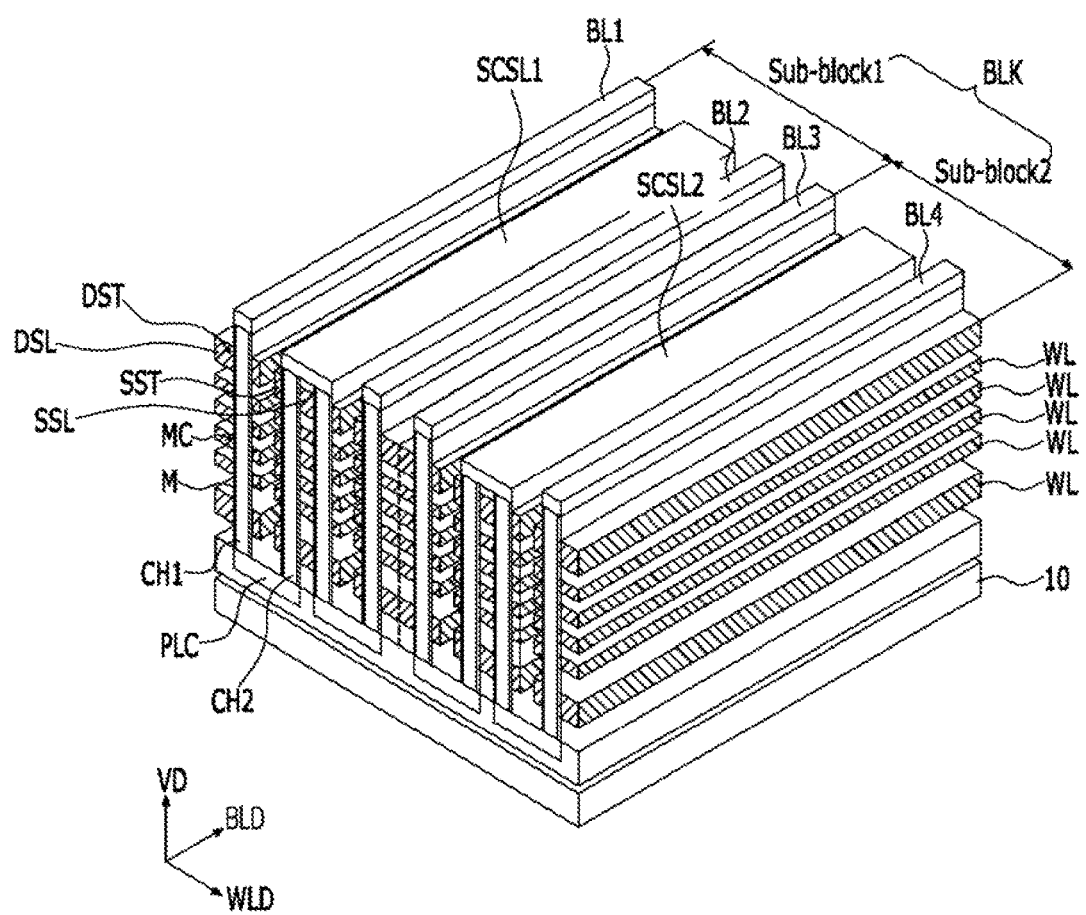
FIG. 7 is a perspective view illustrating a structure of a memory block included in the memory cell array shown in FIG. 2, according to an embodiment of the present invention.

However, as shown in FIG. 7, each pair of channels CH1 and CH2 may be coupled to form 'U' shape through a pipeline channel PLC which is formed under the memory block BLK, and all of bit lines BL1, BL2, BL3 and BL4 and sub common sources SCSL1 and SCSL2 may be disposed on the memory block BLK. In this case, the sub common sources SCSL1 and SCSL2 may be constructed by wiring lines which extend in a direction parallel to the bit lines BL1, BL2, BL3 and BL4.

Figure 8:
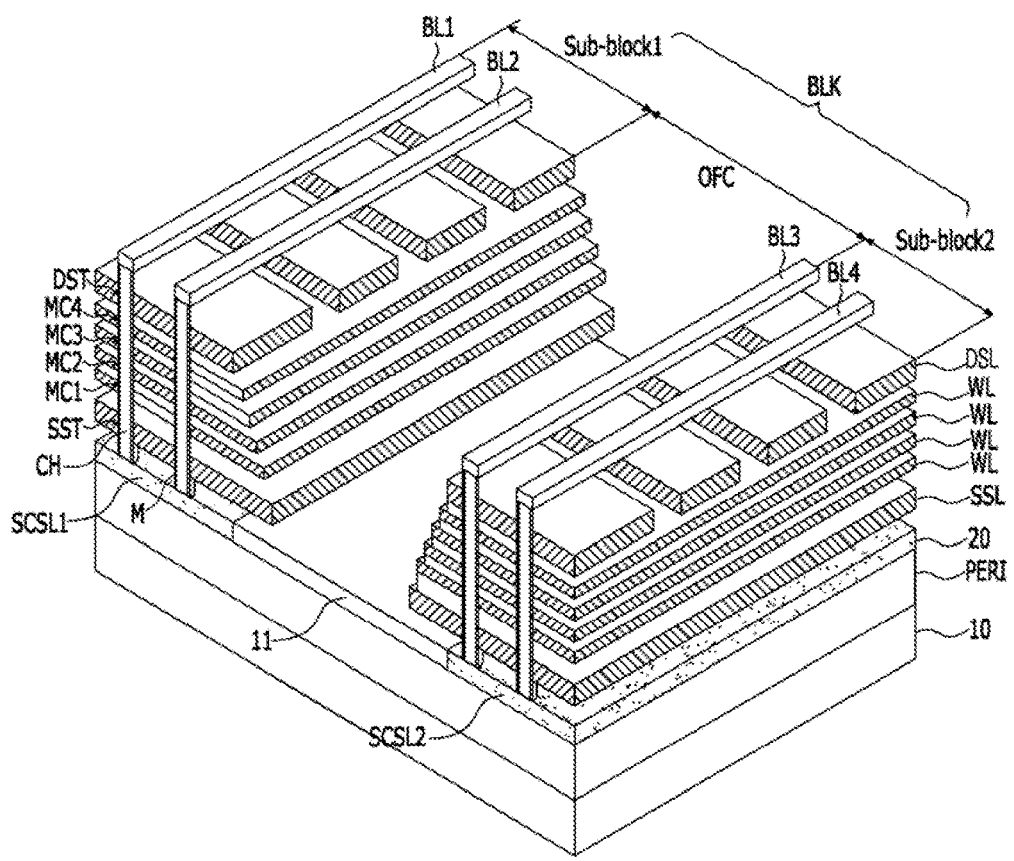
FIG. 8 is a diagram illustrating a perspective view of a structure of a memory block included in the memory cell array shown in FIG. 2, according to an embodiment of the present invention.
Figure 9:
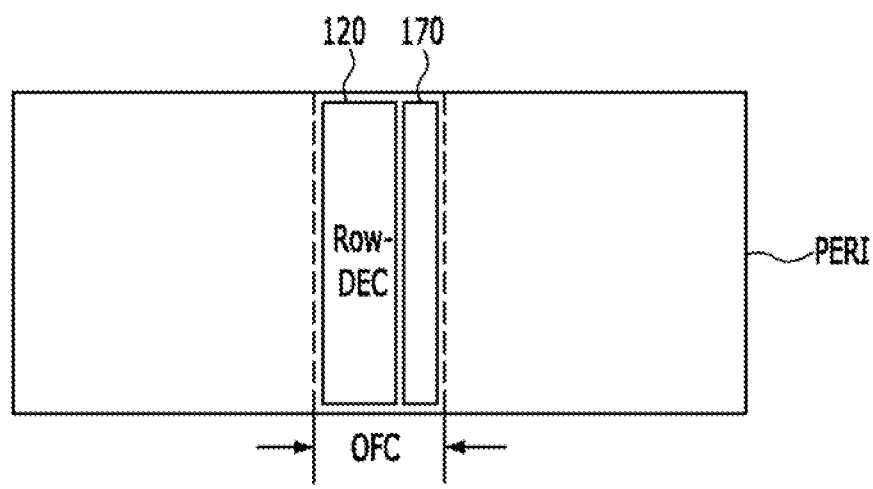
FIG. 9 is a plan view illustrating a peripheral circuit formed in a circuit layer of FIG. 8.

FIG. 8 is a perspective view illustrating a structure corresponding to any one of the memory blocks shown in FIG. 2, and FIG. 9 is a plan view schematically illustrating a configuration example peripheral circuits formed in a circuit layer PERI of FIG. 8.

Referring to FIG. 8, a semiconductor layer 20 may be formed between a substrate 10 and a memory block BLK. The semiconductor layer 20 may include silicon (Si), germanium (Ge) or a mixture thereof, may be a semiconductor doped with an impurity such as a III group, IV group and/or V group element, or may be an intrinsic semiconductor not doped with an impurity.

The memory block BLK may include a source select line SSL, a plurality of word lines WL, a plurality of drain select lines DSL which are stacked or formed on the substrate 10 and a plurality of vertically extending channels CH.

The memory block BLK may include first and second sub blocks Sub-block1 and Sub-block2. The first and second sub blocks Sub-block1 and Sub-block2 may be arranged in the word line direction WLD with an open region OFC interposed therebetween. That is to say, the first sub block Sub-block1 and the second sub block Sub-block2 may be separated from each other with the open region OFC interposed therebetween.

As the drain select lines DSL, the source select line SSL and the word lines WL of the memory block BLK are cut in the open region OFC, the drain select lines DSL, the source select line SSL and the word lines WL of the first sub block Sub-block1 and the drain select lines DSL, the source select line SSL and the word lines WL of the second sub block Sub-block2 may be physically isolated.

A first sub common source SCSL1 may be formed in the semiconductor layer 20 under the first sub block Sub-block1 and a second sub common source SCSL2 may be formed in the semiconductor layer 20 under the second sub block Sub-block2. An isolation structure 11 may be formed in the semiconductor layer 20 of the open region OFC for isolating the first and second sub common sources SCSL1 and SCSL2.

The first and second sub common sources SCSL1 and SCSL2 may be well regions which are formed by doping a p type or n type impurity into the semiconductor layer 20. The isolation structure 11 may be a dielectric layer. In another embodiment, the isolation structure 11 may be an impurity region which is doped with an impurity of a conductivity type opposite to the first and second sub common sources SCSL1 and SCSL2.

The circuit layer PERI may be formed between the semiconductor layer 20 and the substrate 10. Peripheral circuits may be formed in the circuit layer PERI. The peripheral circuits may include the row decoder 120, the page buffer 130, the input/output buffer 140, the control logic 150, the voltage generator 160 and the source driver 170 as shown in FIG. 1.

Referring to FIG. 9 in the circuit layer PERI of the open region OFC, there may be disposed the row decoder 120 and the source driver 170. In FIG. 9, for the sake of convenience in illustration, only the row decoder 120 and the source driver 170 are illustrated. It may be understood that other peripheral circuits other than the row decoder 120 and the source deriver 170 for example, the page buffer 130, the input/output buffer 140, the control logic 150 and the voltage generator 160 may be disposed in the circuit layer PERI outside the open region OFC.

Referring again to FIGS. 8 and 9, the drain select lines DSL of the first sub block Sub-block1 and the drain select lines DSL of the second sub block Sub-block2 may be electrically coupled with each other by contact plugs (not shown) and wiring lines (not shown), and may share one pass transistors. The source select line SSL of the first sub block Sub-block1 and the source select line SSL of the second sub block Sub-block2 may be electrically coupled with each other by contact plugs (not shown) and wiring lines (not shown), and may share one pass transistor. The word line WL of the first sub block Sub-block1 and the word line WL of the second sub block Sub-block2 which are disposed at the same height may be electrically coupled with each other by contact plugs (not shown) and wiring lines (not shown), and may share one pass transistor. That is to say, the source select lines SSL, the drain select lines DSL and the word lines WL coupled to different sub blocks at the same height may be coupled in common to one pass transistors, and may be provided with the same operation voltages from the pass transistors.

In order for electrical coupling with the contact plugs which transfer the driving signals provided from the pass transistors, to the drain select lines DSL the source select line SSL and the word lines WL, the drain select lines DSL, the source select line SSL and the word lines WL of the first sub block Sub-block1 are formed to gradually project toward the open region OFC in the downward direction. In other words, the drain select lines DSL, the source select line SSL and the word lines WL of the first sub block Sub-block1 may be patterned in a step-like shape in the open region OFC. Similarly, the drain select lines DSL, the source select line SSL and the word lines WL of the second sub block Sub-block2 may be patterned in a step-like shape in the open region OFC.

The source driver 170 may be disposed in the circuit layer PERI of the open region OFC, and be electrically coupled with the first sub common source SCSL1 and the second sub common source SCSL2. Namely, the first sub common source SCSL1 and the second sub common source SCSL2 may share the one source driver 170.

It is noted that if it is assumed that a source driver is disposed on the left side of the first sub block Sub-block1 (or the right side of the second sub block Sub-block2) then in this case, as a distance from the source driver disposed on the left side of the first sub block Sub-block1 to the second sub common source SCSL2 (or a distance from the source driver disposed on the right side of the second sub block Sub-block2 to the first sub common source SCSL1) is lengthened, the source voltage outputted from the source driver cannot help but be provided to the second sub common source SCSL2 (or the first sub common source SCSL1) in a state in which the integrity thereof is degraded during a transfer process. As the source voltage of which integrity is degraded is provided to the second sub common source SCSL2 (or the first sub common source SCSL1), a nonvolatile memory device may deteriorate in its operational characteristic or may malfunction.

Meanwhile, if source drivers are respectively disposed on the left side of the first sub block Sub-block1 and the right side of the second sub block Sub-block2, the source voltages outputted from the source drivers may be transferred to the first sub common source SCSL1 and the second sub common source SCSL2 without being substantially degraded in their integrities. However, as the number of source drivers is increased to 2, an area occupied by the source drivers increases and due to this fact, a chip size increases.

In the present embodiment, because the source driver 170 is disposed in the open region OFC between the first sub block Sub-block1 and the second sub block Sub-block2, the distance from the source driver 170 to the first sub common source SCSL1 and the distance from the source driver 170 to the second sub common source SCSL2 are short. Accordingly, by using one source driver, it is possible to provide a source voltage of high integrity to the first sub common source SCSL1 and the second sub common source SCSL2. Also, by employing a single driver for the two neighboring sub blocks the area occupied by the source driver is minimized and thus the chip size may not increase.

In the embodiment described above with reference to FIGS. 3 to 9, it is illustrated, as an example, that the sub common sources SCSL1 and SCSL2 are arranged in the word line direction WLD.

However, the arrangement direction of the sub common sources SCSL1 and SCSL2 is not limited thereto, and it is to be noted that the sub common sources SCSL1 and SCSL2 may be disposed in the bit line direction BLD. Such an embodiment will become apparent through the following descriptions made with reference to FIGS. 10 to 13.

Figure 10:
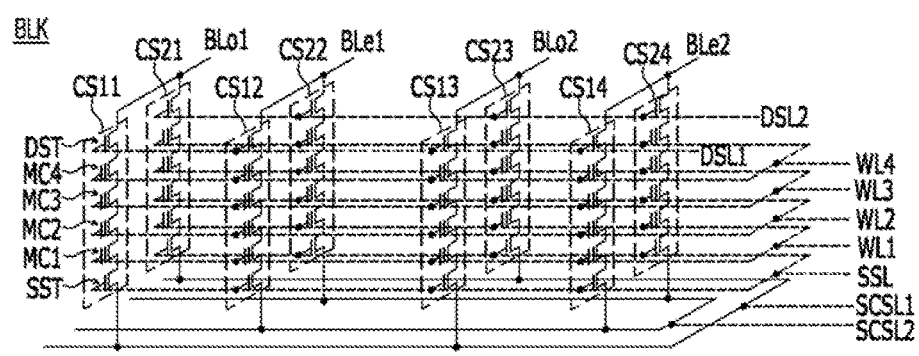
FIG. 10 is a circuit diagram illustrating a configuration corresponding to a memory block included in the memory array of shown in FIG. 2, according to an embodiment of the present invention.
Figure 10:

FIG. 10 is a circuit diagram illustrating any one of the memory blocks shown in FIG. 2.

Referring to FIG. 10, a memory block BLK may include a plurality of cell strings CS11, CS21, CS12, CS22, CS13, CS23, CS14 and CS24. Bit lines BLo1, BLo2, BLe1 and BLe2 may include odd bit lines BLo1 and BLo2 and even bit lines BLe1 and BLe2.

The cell strings CS11 and CS21 may be electrically coupled between the odd bit line BLo1 and a first sub common source SCSL1, and the cell strings CS12 and CS22 may be electrically coupled between the even bit line BLe1 and a second sub common source SCSL2. The cell strings CS13 and CS23 may be electrically coupled between the odd bit line BLo2 and the first sub common source SCSL1 and the cell strings CS14 and CS24 may be electrically coupled between the even bit line BLe2 and the second sub common source SCSL2.

The memory block BLK may include a plurality of sub blocks Sub-block1 and Sub-block2. For example, the memory block BLK may include a first sub block Sub-block1 which includes the cell strings CS11, CS21, CS13 and CS23 and a second sub block Sub-block2 which includes the cell strings CS12, CS22, CS14 and CS24.

The first sub block Sub-block1 may correspond to the first sub common source SCSL1, and the cell strings CS11, CS21, CS13 and CS23 included in the first sub block Sub-block1 may be electrically coupled in common to the first sub common source SCSL1. The second sub block Sub-block2 may correspond to the second sub common source SCSL2, and the cell strings CS12, CS22, CS14 and CS24 included in the second sub block Sub-block2 may be electrically coupled in common to the second sub common source SCSL2. That is to say, cell strings included in the same sub block are electrically coupled to the same sub common source, and cell strings included in different sub blocks are may be electrically coupled to different sub common sources.

The cell strings CS11, CS21, CS13 and CS23 included in the first sub block Sub-block1 may be electrically coupled to the odd bit lines BLo1 and BLo2, and the cell strings CS12, CS22, CS14 and CS24 included m the second sub block Sub-block2 may be electrically coupled to the even bit lines BLe1 and BLe2.

The respective first and second sub common sources SCSL1 and SCSL2 may each have a structure which extends in the word line direction WLD. The first and second sub common sources SCSL1 and SCSL2 may be arranged at different levels in the bit line direction BLD.

Each of the cell strings CS11, CS21, CS12, CS22, CS13, CS23, CS14 and CS24 may include a drain select transistor DST, a plurality of memory cells MC1 to MC4 and a source select transistor SST which are coupled in a direction perpendicular to the main surface of a substrate (not shown). In each of the cell strings CS11, CS21, CS12, CS22, CS13, CS23, CS14 and CS24, the memory cells MC1 to MC4 may be coupled in series between the drain select transistor DST and the source select transistor SST. The memory cells MC1 to MC4 may include main memory cells which are used to store valid data. The memory cells MC1 to MC4 may further include, in addition to main memory cells, dummy memory cells which are not used to store valid data.

One terminal of each of the source select transistors SST of the cell strings CS11, CS21, CS13 and CS23 included in the first sub block Sub-block1 may be electrically coupled to the memory cells MC1, and the other terminal thereof may be electrically coupled in common to the first sub common source SCSL1. One terminal of each of the source select transistors SST of the cell strings CS12, CS22, CS14 and CS24 included in the second sub block Sub-block2 may be electrically coupled to the memory cells MC1, and the other terminal thereof may be electrically coupled in common to the second sub common source SCSL2.

One terminal of each of the drain select transistors DST of the cell strings CS11, CS21, CS13 and CS23 included in the first sub block Sub-block1 may be electrically coupled to the odd bit lines BLo1 and BLo2, and the other terminal thereof may be electrically coupled to the memory cells MC4. One terminal of each of the drain select transistors DST of the cell strings CS12, CS22, CS14 and CS24 included in the second sub block Sub-block2 may be electrically coupled to the even bit lines BLe1 and BLe2, and the other terminal thereof may be electrically coupled to the memory cells MC4.

For instance, in FIG. 10, the memory block BLK is illustrated as including 2 sub blocks Sub-block1 and Sub-block2. However, the number of sub blocks included in a memory block is not limited thereto, and at least two sub blocks may be provided.

For instance, in FIG. 10, each of the sub blocks Sub-block1 and Sub-block2 is illustrated as including 4 cell strings. However, the number of cell strings included in each of the sub blocks Sub-block1 and Sub-block2 is not limited thereto, and, among cell strings included in each of the sub blocks Sub-block1 and Sub-block2, one or more cell strings may be provided in each of the bit line direction BLD and the word line direction WLD.

Further, FIG. 10 shows an example in which the source select transistors SST are coupled in common to one source select line SSL. However, it is to be noted that the structure of the memory block BLK may be changed and applied in such a manner that, similarly to the drain select transistors DST, source select transistors SST of the same row are coupled in common to one source select line and source select transistors SST of different rows are coupled to different source select lines.

For instance, it is illustrated in FIG. 10 that one drain select transistor DST and one source select transistor SST are provided in each cell string. However, it is to be noted that at least two drain select transistors or at least two source select transistors may be provided in each cell string.

For instance, it is illustrated in FIG. 10 that each cell string includes 4 memory cells MC1 to MC4. However, it is to be noted that at least one memory cell may be provided in each cell string.

Figure 11:
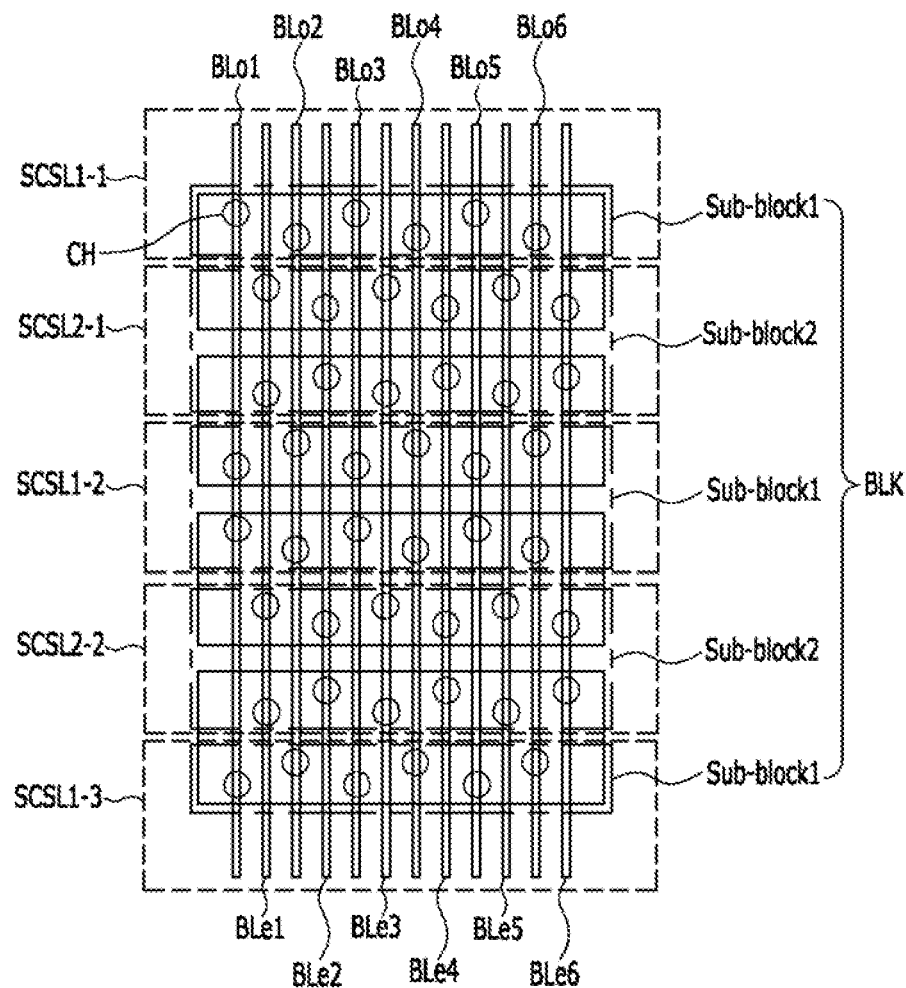
FIG. 11 is a plan view illustrating a structure of a memory block included in the memory array shown in FIG. 2, according to an embodiment of the present invention.
Figure 11:
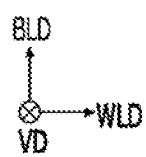
Figure 12:
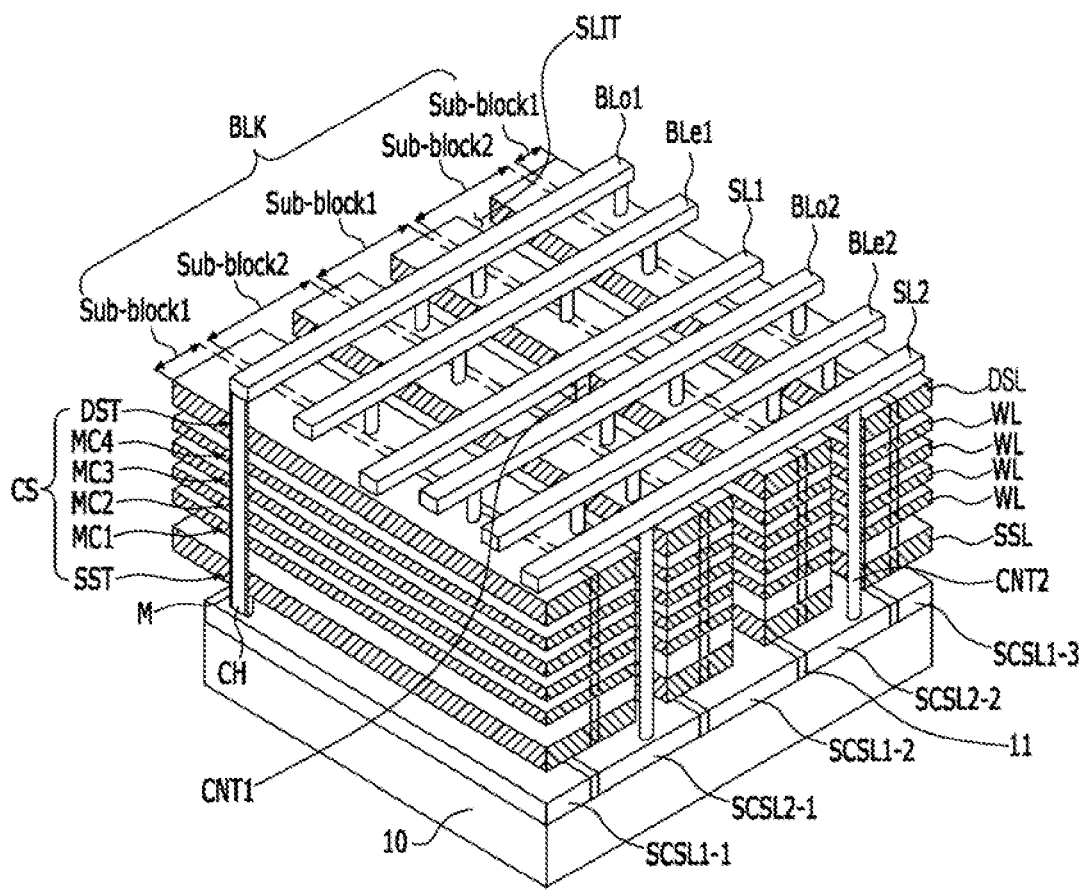
FIG. 12 is a perspective view of the memory block of FIG. 11.
Figure 13:
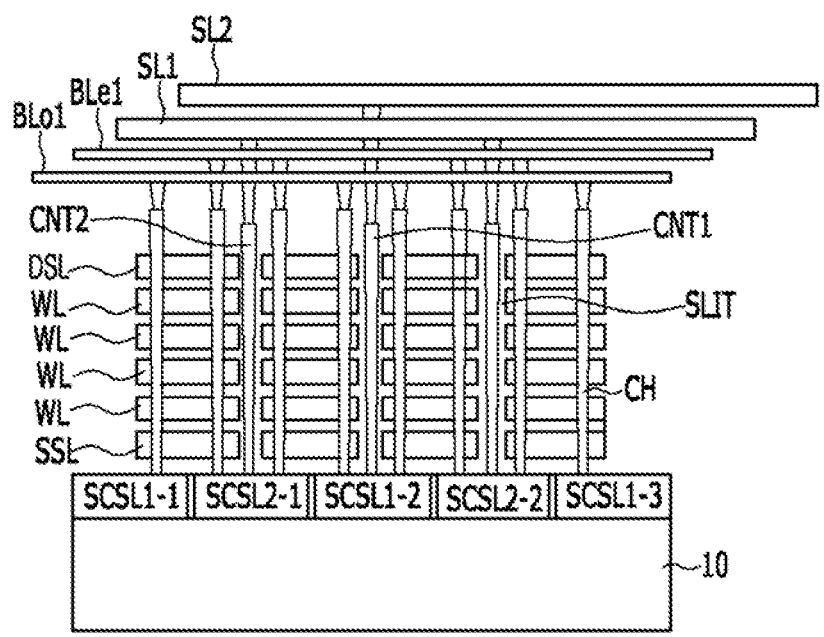
FIG. 13 is a cross-sectional view of the memory block of FIG. 11.

FIG. 11 is a plan view illustrating structure corresponding to any one of the memory blocks shown in FIG. 2, FIG. 12 is a perspective view of FIG. 11, and FIG. 13 is a cross-sectional view of FIG. 11.

Referring to FIG. 11, a nonvolatile memory device may include first and second sub common sources SCSL1 and SCSL2, a memory block BLK formed on the first and second sub common sources SCSL1 and SCSL2, and a plurality of odd bit lines BLo1 to BLo6 and a plurality of even bit lines BLe1 to BLe6 formed on the memory block BLK.

For instance, it is illustrated in FIGS. 11 to 13 that the number of sub common sources SCSL corresponding to the single memory block BLK is 2. However, the number of sub common sources SCSL corresponding to the single memory block BLK is not limited thereto, and it is to be noted that at least two sub common sources SCSL corresponding to the single memory block BLK may be provided.

For instance, it is illustrated in FIG. 11 that each of the number of odd bit lines and the number of even bit lines is 6. However, each of the number of odd bit lines and the number of even bit lines is not limited thereto, and it is to be noted that one or more odd bit lines and one or more even bit lines may be provided.

Referring to FIGS. 12 and 13, the first and second sub common sources SCSL1 and SCSL2 may be formed in a substrate 10. The substrate 10 may include a bulk silicon substrate. The bulk silicon substrate may include a semiconductor material such as a III group, IV group and/or V group element. The first and second sub common sources SCSL1 and SCSL2 may be well regions which are formed by implanting a p type or n type impurity into the substrate 10.

The first sub common source SCSL1 may include a plurality of segments SCSL1-1, SCSL1-2 and SCSL1-3. Hereinbelow, for the sake of convenience in explanation, the segments SCSL1-1, SCSL1-2 and SCSL1-3 included in the first sub common source SCSL1 will be defined as first segments. The respective first segments SCSL1-1, SCSL1-2 and SCSL1-3 may extend in the word line direct on WLD, and may be electrically coupled with one another.

The second sub common source SCSL2 may include a plurality of segments SCSL2-1 and SCSL2-2. Hereinbelow, for the sake of convenience in explanation, the segments SCSL2-1 and SCSL2-2 included in the second sub common source SCSL2 will be defined as second segments. The respective second segments SCSL2-1 and SCSL2-2 may extend in the word line direction WLD, and may be electrically coupled with each other.

The first segments SCSL1-1, SCSL1-2 and SCSL1-3 and the second segments SCSL2-1 and SCSL2-2 may be disposed alternately in the bit line direction BLD.

Isolation structures 11 may be formed in the substrate 10 between the first segments SCSL1-1, SCSL1-2 and SCSL1-3 and the second segments SCSL2-1 and SCSL2-2. The isolation structures 11 may be a dielectric layer. Unlike this, the isolation structures 11 may be impurity regions which are doped with an impurity of a conductivity type opposite to the first and second sub common sources SCSL1 and SCSL2. The isolation structures 11 may have line shapes which extend in the word line direction WLD, and the first segments SCSL1-1, SCSL1-2 and SCSL1-3 and the second segments SCSL2-1 and SCSL2-2 may be disposed alternately in the bit line direction BLD with the isolation structures 11 interposed therebetween.

Unlike the embodiment shown in FIGS. 12 and 13, a semiconductor layer may be additionally formed between the substrate 10 and the memory block BLK, and the first segments SCSL1-1, SCSL1-2 and SCSL1-3, the second segments SCSL2-1 and SCSL2-2 and the isolation structures 11 may be formed in the semiconductor layer. A circuit layer may be additionally formed between the substrate 10 and the semiconductor layer. Peripheral circuits may be formed in the circuit layer. The peripheral circuits may include the row decoder 120, the page buffer 130, the input/output buffer 140, the control logic 150, the voltage generator 160 and the source driver 170 as shown in FIG. 1. Such an embodiment including a semiconductor layer and a circuit layer may be understood by referring to the embodiment described above with reference to FIG. 8.

Referring again to FIGS. 12 and 13 the memory block BLK may have a 3-dimensional structure. The memory block BLK may include a source select line SSL, a plurality of word lines WL, a drain select line DSL and a plurality of channels CH which are stacked or formed on the substrate 10.

The channels CH may pass through the select lines SSL and DSL and the word lines WL. In the present embodiment, each of the channels CH has a pillar structure which is completely filled up to the center thereof. However, it is to be noted that the embodiment is not limited thereto. Each of the channels CH may have a tube shape in which a central region is open, and in this case, a dielectric layer may be filled in the central region that is open. A memory layer M may be formed on the surfaces of the channels CH. The memory layer M may include a tunnel dielectric layer, a charge storage layer and a charge blocking layer or include at least one of them. The charge storage layer may include at least one of a floating gate, such as a polysilicon layer, which stores charges, a trap layer, such as a nitride layer, which traps charges, and a nano-dot. For reference, the memory layer M may include a phase change material in place of the charge storage layer. Further, a memory layer (not shown) which is interposed between the memory layer M and the word lines WL and covers the top surfaces and bottom surfaces of the word lines WL may be additionally formed. The additionally formed memory layer may include a tunnel dielectric layer, a charge storage layer and a charge blocking layer or may include at least one of them. The charge blocking layer of the additionally formed memory layer may be a stack layer of an oxide layer and a high-k material layer.

Source select transistors SST are formed where the source select line SSL surrounds the channels CH, memory cells MC are formed where the word lines WL surround the channels CH, and drain select transistors DST are formed where the drain select line DSL surrounds the channels CH. By the above-described structure, a plurality of cell strings CS including the drain select transistors DST, the memory cells MC and the source select transistors SST which are formed along the respective channels CH may be constructed.

The memory block BLK may include a first sub block Sub-block1 corresponding to the first sub common source SCSL1 and a second sub block Sub-block2 corresponding to the second sub common source SCSL2. The first sub block Sub-block1 and the second sub block Sub-block2 may be disposed on the sub common sources SCSL1 and SCSL2 respectively corresponding to them. Accordingly, the first and second sub blocks Sub-block1 and Sub-block2 may be arranged in the bit line direction BLD in the same manner as the first segments SCSL1-1, SCSL1-2 and SCSL1-3 included in the first sub common source SCSL1 and the second segments SCSL2-1 and SCSL2-2 included in the second sub common source SCSL2.

Bit lines BLo1, BLo2, BLe1 and BLe2 may include odd bit lines BLo1 and BLo2 and even bit lines BLe1 and BLe2.

The odd bit lines BLo1 and BLo2 may be electrically coupled with cell strings CS included in the first sub block Sub-block1, and the even bit lines BLe1 and BLe2 may be electrically coupled with cell strings CS included in the second sub block Sub-block2. That is to say, cell strings coupled to the same bit line may be included in the same sub block, and cell strings included in different sub blocks may be coupled to different bit lines.

Slits SLIT which expose the first segments SCSL1-1, SCSL1-2 and SCSL1-3 and the second segments SCSL2-1 and SCSL2-2 may be formed in the source select line SSL, the word lines WL and the drain select line DSL. The source select line SSL, the word lines WL and the drain select line DSL may be divided into pluralities of portions by the slits SLIT.

Source lines SL1 and SL2 may be additionally formed on the memory block BLK. The source lines SL1 and SL2 may be disposed in a layer lying under the bit lines BLo1, BLe1, BLo2 and BLe2. While not shown, the source lines SL1 and SL2 may be disposed in the same layer as the bit lines BLo1, BLe1, BLo2 and BLe2 or a layer lying over the bit lines BLo1, BLe1, BLo2 and BLe2, or may be disposed by being distributed in at least two layers.

The source lines SL1 and SL2 may include a first source line SL1 for providing source power to the first sub common source SCSL1 and a second source line SL2 for providing source power to the second sub common source SCSL2.

In slits SLIT positioned in the first segments SCSL1-1, SCSL1-2 and SCSL1-3 among the slits SLIT formed in the memory block BLK, there may be formed first contact plugs CNT1 which electrically couple the first source line SL1 and the first segments SCSL1-1, SCSL1-2 and SCSL1-3.

In slits SLIT positioned in the second segments SCSL2-1 and SCSL2-2 among the slits SLIT formed in the memory block BLK, there may be formed second contact plugs CNT2 which electrically couple the second source line SL2 and the second segments SCSL2-1 and SCSL2-2.

FIG. 14 is a simplified block diagram schematically illustrating a memory system 600 including a nonvolatile memory device 620, according to an embodiment of the present invention.

The nonvolatile memory device 620 may include a semiconductor memory, according to an embodiment of the inventive concept as described above. The memory system 600 may also include a memory controller 610. The memory controller 610 may control the nonvolatile memory device 620. For example, the combination of the nonvolatile memory device 620 and the memory controller 610, may be configured as a memory card or a solid state disk (SSD). An SRAM 611 may be used as the working memory of a central processing unit (CPU) 612. A host interface 613 may include the data exchange protocol of a host which may be coupled with the memory system 600.

The memory controller 610 may include the host interface 613, an error correction code (ECC) block 614, a memory interface 615, the CPU 612 and the SRAM 611 electrically coupled via an internal bus.

The error correction code (ECC) block 614 may detect and correct an error included in the data read out from the nonvolatile memory device 620.

The memory interface 615 may interface with the nonvolatile memory device 620. The CPU 612 may perform general control operations for data exchange of the memory controller 610.

Although not shown it should become apparent to a person skilled in the art that the memory system 600 may further be provided with a ROM which stores code data for interfacing with the host. The nonvolatile memory device 620 may be provided as a multi-chip package constructed by a plurality of flash memory chips.

The memory system 600 may be used as a storage medium of high reliability having a low probability of an error occurring. The aforementioned nonvolatile memory device may be provided for a memory system such as a solid state disk (SSD). The memory controller 610 may communicate with an external device (for example, the host) through one of various interface protocols such as a universal serial bus (UBS) protocol, a multimedia card (MMC) protocol, a peripheral component interconnection express (PCI-E) protocol, a serial advanced technology attachment (SATA) protocol, a parallel advanced technology attachment (PATA) protocol, a small computer system interface (SCSI) protocol, an enhanced small disk interface (ESDI) protocol and an integrated device electronics (IDE) protocol and the like.

Figure 15:
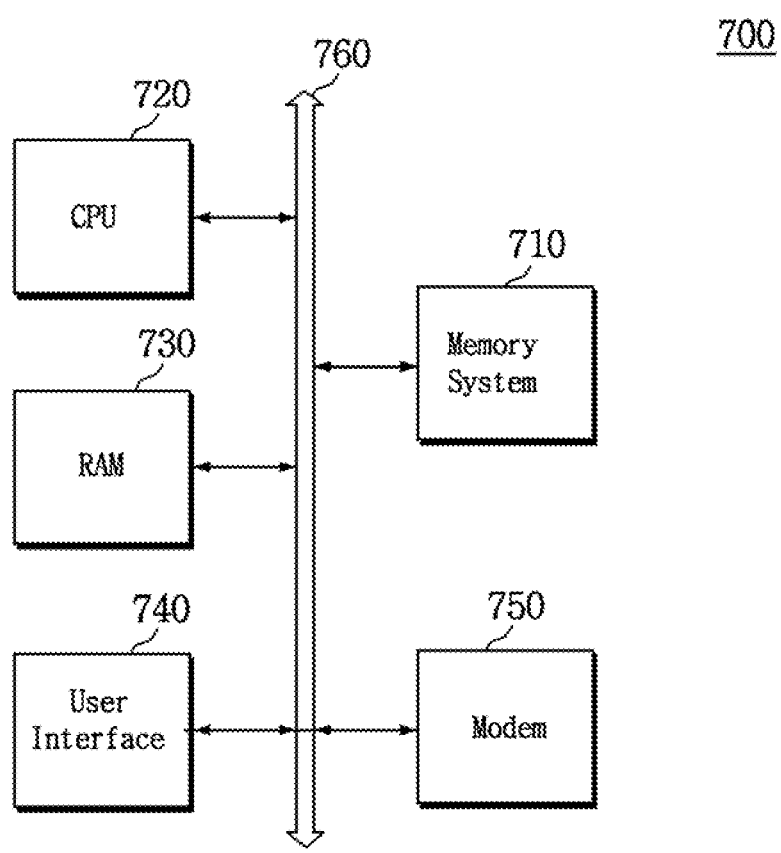
FIG. 15 is a simplified block diagram schematically illustrating a computing system including a nonvolatile memory device, according to an embodiment of the present invention.

FIG. 15 is a simplified block diagram schematically illustrating a computing system including a nonvolatile memory device, according to an embodiment of the present invention.

Referring to FIG. 15, a computing system 700 according to an embodiment of the present invention may include a memory system 710, a microprocessor (or CPU) 720, a RAM 730, a user interface 740, and a modern 750 such as a baseband chipset, which are electrically coupled to a system bus 760. In an embodiment, the computing system 700 may be a mobile device, in which case a battery (not shown) for supplying the operating voltage of the computing system 700 may be additionally provided. Although not shown in the drawing, it should become apparent to a person skilled in the art that the computing system 700 may further comprise an application chipset, a COMS image sensor (CIS) a mobile DRAM and so on. The memory system 710 may be configured, for example, as a solid state drive/disk (SSD) which uses a nonvolatile memory to store data. Also as an example, the memory system 710 may be provided as a fusion flash memory (for example, a NAND or a NOR flash memory).

The above-described embodiments may be realized by a device and a method as described above. However, we note that the above-described embodiments may also be realized by a program which performs a function corresponding to the configuration of each embodiment or a recording medium on which the program is recorded. Such realization may be easily derived from the descriptions of the above-described embodiments by a person skilled in the art to which the present invention pertains.

While various embodiments have been described above, it will be understood to those skilled in the art that the embodiments described are by way of example only. Accordingly, the nonvolatile memory device described herein should not be limited based on the described embodiments.

What is claimed is:

1. A nonvolatile memory device comprising:
a memory block including a plurality of cell strings each of which includes memory cells electrically coupled with word lines stacked over a substrate; and
a plurality of sub common sources, each sub common source corresponding to a subset of cell strings of the plurality of cell strings and electrically coupled to a first end of each cell string within the corresponding subset of cell strings;
a plurality of bit line groups each including a plurality of bit lines, each bit line group corresponding to each subset of cell strings, each bit line electrically coupled to a second end of one or more cell strings within the corresponding subset of cell strings,
wherein the memory block includes a plurality of sub blocks corresponding to the plurality of sub common sources, so that each sub block includes the subset of cell strings which are electrically coupled to a same sub common source, and the subsets of cell strings included in different sub blocks are electrically coupled to different sub common sources,
wherein each of the cell strings includes at least one drain select transistor, a plurality of memory cells and at least one source select transistor connected in series between the corresponding bit line and the corresponding sub common source,
wherein the subset of cell strings included in a same sub block are electrically coupled to bit lines included in a same bit line group, and the subsets of cell strings included in different sub blocks are electrically coupled to bit lines included in different bit line groups,
wherein, in the erase operation, the erase voltage is applied to a sub common source corresponding to a selected sub block among the plurality of sub common sources, and an unselected erase voltage is applied to a sub common source corresponding to an unselected sub block among the plurality of sub common sources.

2. The nonvolatile memory device according to claim 1, wherein an erase operation is performed by unit of sub block by applying an erase voltage individually to the sub common sources.

3. The nonvolatile memory device according to claim 2, wherein, in the erase operation, the erase voltage is applied to a sub common source corresponding to a selected sub block among the plurality of sub common sources, and an unselected erase voltage is applied to a sub common source corresponding to an unselected sub block among the plurality of sub common sources.

4. The nonvolatile memory device according to claim 1, wherein the sub common sources are arranged in a word line direction.

5. The nonvolatile memory device according to claim 1, wherein the bit lines include at least one odd bit line and at least one even bit line, and
wherein the bit line groups include a first bit line group including the at least one odd bit line and a second bit line group including the at least one even bit line,
wherein the sub blocks comprise:
a first sub block including cell strings electrically coupled between the at least one odd bit line of the first bit line group and a first sub common source among the plurality of sub common sources; and
a second sub block including cell strings electrically coupled between the at least one even bit line of the second bit line and a second sub common source among the plurality of sub common sources.

6. The nonvolatile memory device according to claim 5, wherein the sub common sources comprise:
a first sub common source electrically coupled with the cell strings of the first sub block; and
a second sub common source electrically coupled with the cell strings of the second sub block.

7. The nonvolatile memory device according to claim 6, wherein the first sub common source includes a plurality of first segments, and the second sub common source includes a plurality of second segments, and
wherein the first segments and the second segments are alternately disposed in a bit line direction.

8. The nonvolatile memory device according to claim 7, further comprising:
slits passing through the memory block and exposing the first segments and the second segments.

9. The nonvolatile memory device according to claim 8, further comprising:
a first source line and a second source line disposed over the memory block;
first contact plugs disposed in the slits which expose the first segments, and electrically coupling the first segments and the first source line; and
second contact plugs disposed in the slits which expose the second segments, and electrically coupling the second segments and the second source line.

10. The nonvolatile memory device according to claim 1, wherein the sub common sources are disposed under the memory block, and the bit lines are disposed over the memory block.

11. The nonvolatile memory device according to claim 10, wherein the sub common sources are formed in the substrate or a semiconductor layer which is disposed between the substrate and the memory block.

12. The nonvolatile memory device according to claim 11, wherein the sub common sources comprise well regions which are formed in the substrate or the semiconductor layer.

13. The nonvolatile memory device according to claim 11, further comprising:
an isolation structure formed in the substrate or the semiconductor layer between the sub common sources.

14. The nonvolatile memory device according to claim 1, wherein the sub common sources and the bit lines are disposed over the memory block.

15. The nonvolatile memory device according to claim 14, wherein the sub common sources comprise wiring lines which extend in a lengthwise direction of the bit lines.

16. A nonvolatile memory device comprising:
a memory block electrically coupled to word lines stacked over a substrate;
a first sub common source and a second sub common source arranged in a direction of the word lines; and
a first bit line group including a plurality of first bit lines formed over the memory block and corresponding to the first sub common source, and a second bit line group including a plurality of second bit lines formed over the memory block and corresponding to the second sub common source,
the memory block comprising:

a first sub block including a plurality of first cell strings which are electrically coupled between the first bit lines of the first bit line group and the first sub common source; and a second sub block including a plurality of second cell strings which are electrically coupled between the second bit lines of the second bit line group and the second sub common source, wherein each of the first cell strings includes at least one drain select transistor, a plurality of memory cells and at least one source select transistor connected in series between one of the first bit lines of and the first sub common source, wherein each of the second cell strings includes at least one drain select transistor, a plurality of memory cells and at least one source select transistor connected in series between one of the second bit lines and the second sub common source, wherein, in the erase operation, the erase voltage is applied to a sub common source corresponding to a selected sub block among the first and second sub common sources, and an unselected erase voltage is applied to a sub common source corresponding to an unselected sub block among the first and second sub common sources.

17. A nonvolatile memory device comprising:
bit lines including odd bit lines and even bit lines;
a memory block disposed under the bit lines; and
a first sub common source and a second sub common source disposed under the memory block and arranged in a direction of the bit lines,
the memory block comprising:
a first sub block including a plurality of cell strings which are electrically coupled between the odd bit lines and the first sub common source, and a plurality of cell strings which are electrically coupled between the even bit lines and the first sub common source; and
a second sub block including a plurality of cell strings which are electrically coupled between the odd bit lines and the second sub common source, and a plurality of cell strings which are electrically coupled between the even bit lines and the second sub common source.

18. The nonvolatile memory device according to claim 17,
wherein the first sub common source includes a plurality of first segments, and the second sub common source includes a plurality of second segments, and
wherein the first segments and the second segments are alternately disposed in a bit line direction.

* * * * *